United States Patent
Smith et al.

(10) Patent No.: US 6,556,444 B2
(45) Date of Patent: Apr. 29, 2003

(54) APPARATUS AND METHOD FOR COOLING A WEARABLE ELECTRONIC DEVICE

(75) Inventors: Gordon James Smith, Rochester, MN (US); George Willard Van Leeuwen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 09/853,441

(22) Filed: May 11, 2001

(65) Prior Publication Data

US 2002/0186535 A1 Dec. 12, 2002

(51) Int. Cl.[7] ................................................ H05K 7/20
(52) U.S. Cl. ........................ 361/704; 361/705; 361/707; 165/80.3; 437/902
(58) Field of Search ............................... 361/683, 686, 361/687, 688, 697, 704–714, 732; 257/706–722, 178; 165/80.2, 80.3, 80.4, 185, 146; 156/256, 327, 296; 266/152, 176.1; 437/902

(56) References Cited

U.S. PATENT DOCUMENTS

| | | | | |
|---|---|---|---|---|
| 4,312,913 A | * | 1/1982 | Rheaume | 428/257 |
| 4,932,524 A | * | 6/1990 | Hodson | 206/320 |
| H1699 H | * | 12/1997 | Vavrick | 156/276 |
| 5,774,338 A | * | 6/1998 | Wessling | 361/730 |
| 5,849,130 A | * | 12/1998 | Browne | 156/256 |
| 6,096,414 A | * | 8/2000 | Young | 428/220 |
| 6,110,847 A | * | 8/2000 | Yamamoto et al. | 442/179 |
| 6,282,089 B1 | * | 8/2001 | Nakanishi et al. | 361/687 |
| 6,324,055 B1 | * | 11/2001 | Kawabe | 361/687 |
| 6,404,070 B1 | * | 6/2002 | Higashi et al. | 257/796 |

FOREIGN PATENT DOCUMENTS

| | | | | | |
|---|---|---|---|---|---|
| JP | 405016275 A | * | 1/1993 | | B32B/5/28 |
| JP | 406216285 A | * | 8/1994 | | H01L/23/373 |

* cited by examiner

Primary Examiner—Darren Schuberg
Assistant Examiner—Michael Datskovsky
(74) Attorney, Agent, or Firm—Wood, Herron & Evans, LLP

(57) ABSTRACT

A system for cooling an electronic device containing a heat-generating component, comprises a surface thermally coupled to the heat-generating component to be heated by the component. A fabric material is positioned proximate the surface, and includes a plurality of fibers having heat conductive properties. The fabric material is configured for engaging the heated surface such that the heat conductive fibers of the fabric material are operable for conducting heat away from the surface to cool the component and the electronic device.

26 Claims, 3 Drawing Sheets

APPARATUS AND METHOD FOR COOLING A WEARABLE ELECTRONIC DEVICE

FIELD OF THE INVENTION

This invention relates generally to wearable electronic devices, such as computers and audio-video devices, and more specifically to a system and method for cooling such electronic devices when worn on the body of a user.

BACKGROUND OF THE INVENTION

In today's society, electronic devices are becoming more indispensable for everyday tasks. For example, personal computers have become more popular in everyday life, and therefore are often necessary in the daily activities of a computer user. As such, many people desire almost constant access to their computers and other electronic devices. As technology and communications advance, and as more goods and services are available through the use of a computer, such as over the Internet, the desire for constant access will continue to increase among computer users. This same rationale applies to electronic devices such as audio and video devices which might be used for communications.

Conventionally, computers and other electronic devices utilized by individuals and businesses are stand-alone devices which are generally permanently placed on a desk top, table top, floor, or other support surface. While they may be readily moved from place to place, they are not meant to be constantly carried around by the user. To address the need for portability, many electronic devices are portable, and portable computers are available which are carried by the user, generally in a specially made suitcase or bag. Existing portable computers and other similar devices continue to decrease in size and weight, but are still designed to be carried like luggage in a separate bag or other container and are then subsequently used by placing them on an available support surface, such as a desk top.

Recently, wearable computers and wearable audio and video systems have become available. Wearable electronic devices, such as a wearable personal computer, are meant to be used while being worn on the body of the user. Such wearable devices are usually carried on the body without having to be hand-carried like luggage and are more likely to be used while being worn, rather than being taken off and placed on a support surface. This arrangement provides the user with greater mobility, convenience, and flexibility in the use of the device.

Wearable electronic devices have internal electronic components which generate heat during their operation and the operation of the computer. In particular, electronic devices using high performance processors, such as Intel Pentium-class processors, generate a substantial amount of heat. As a result, the temperature of the processor component and the overall device may exceed operating specifications. Consequently, the electronic components of such devices, and particularly processor components, must be cooled in some way for proper operation. In addition to ensuring proper operation of internal electronic components, wearable computers also must be cooled sufficiently to ensure the comfort of the wearer. Unlike desktop or portable computers, wearable computers will generally be in contact with the user's body and possibly their bare skin while being used.

In existing devices, such as desktop and laptop computers, an internal air moving device, such as an internal fan, may be utilized to direct cooling air over the heat-generating components to cool those components. Additionally, large heat sinks and heat pipes might be utilized. However, existing cooling systems for computers and other devices, while functional for conventional desktop or portable computers, have certain drawbacks with respect to their incorporation into a wearable device.

Cooling components, such as large heat sinks, heat pipes, fans and the like, are generally too large and cumbersome for use in wearable devices. Furthermore, some cooling devices consume too much power to be practical for a wearable device, which will generally be powered from a portable source, such as a battery.

Still further, internal air moving devices, like fans, require relatively large airflow openings in the body or housing of the computer for feeding and exhausting air to and from the internal volume of the computer to cool the electronic components. Such large air flow openings are suitable for existing desktop and portable computers, because those devices will primarily be used indoors and thus are not significantly exposed to outside environmental elements, such as water and dirt. However, wearable devices and computers are worn by a user and are therefore exposed to the environmental elements to which the user is exposed. Consequently, a wearable device will be exposed to water, dirt, and other contaminant elements. Large airflow openings and fans which draw air through the openings also allow the water, dirt, and other contaminating elements into the internal volume of the computer and expose the electronic components to such contaminating elements.

Some versions of wearable computers have been cooled without an internal fan. However, those designs still use relatively large airflow openings. Furthermore, the convective heat transfer between the air surrounding the components and the computer body is very inefficient. This inefficiency results in higher internal component temperatures and less reliable operation.

Therefore, it is an objective to improve the design and operation of electronic devices, such as computers, and more specifically to improve the cooling characteristics of a wearable electronic device.

It is another objective of the invention to cool a wearable device without cumbersome and power-consuming components.

It is another objective to reduce and eliminate exposure of the electronic components of a wearable device to environmental elements which may adversely affect the operation of the device.

It is still another objective to provide a computer for a user to wear without exposing the user to uncomfortably hot surfaces.

These objectives and other objectives of the present invention will become more readily apparent from the further description of the invention below.

SUMMARY OF THE INVENTION

The above objectives and other objectives are addressed by the present invention which comprises a system and method for cooling a wearable electronic device which has a heat-generating component, such as a wearable computer, with a microprocessor component.

The system comprises utilizing a surface which is thermally coupled to the heat-generating component, and is heated by the component. A fabric material is positioned proximate to the surface, and the fabric material includes a plurality of fibers which have heat conductive properties.

For example, metallic fibers such as aluminum, copper, and/or iron fibers might be utilized in the fabric material and woven through the fabric material. The fabric material is configured for engaging the heated surface such that the heat conductive fibers of the fabric material are operable for conducting heat away from the surface to cool the component and the overall electronic device.

In one embodiment of the invention, the heated surface, which is thermally coupled to the component, has a three-dimensional topography. The fabric material engages the three-dimensional topography and engages the heated surface so that the heat conductive fibers weave through the three-dimensional topography of the surface. For example, the fabric material may also have a three-dimensional topography which generally follows at least a portion of the topography of the surface.

In another embodiment of the invention, the fabric material may be pressed against the heated surface for causing conductive contact between the heat conductive fibers and the surface. Alternatively, the heat conductive fibers and the surface may have magnetic properties, such that the surface and the heat conductive fibers are magnetically attracted to each other for good conductive contact. In one example, at least one of the surface and the fibers may be ferromagnetic, while the other of the surface and fibers is permanently magnetized. Alternatively, the surface and/or fibers may be impregnated with magnetic particles.

In still another embodiment, a press device is positioned on one side of the fabric material generally opposite the heated surface. The press device and surface have magnetic properties such that the press device and surface are magnetically attracted to each other to press the fibers into contact with the heated surface to conduct heat away from the surface. For example, at least one of the surface and the press device may be ferromagnetic while the other of the surface and press device is generally magnetized for attraction to the ferromagnetic material.

The magnetic properties of the heat conductive fibers and the heated component surface or press device may also provide alignment between the fabric material and the heat-generating component. For example, in one embodiment of the invention, the fabric material is incorporated into a garment or pack utilized or worn by a person who would be wearing an electronic device, such as a wearable computer. For proper operation of the cooling system of the invention, the fabric material and heat conductive fibers must be aligned with and contact the heated surface in order to conduct heat away from the surface and then convectively exchange heat with the ambient atmosphere. Magnetic attraction between the fabric material and the heated surface or between the surface and a press device coupled to the fabric material will ensure such alignment.

In accordance with another aspect of the present invention, the heat conductive fibers are positioned in the fabric material to lie adjacent an inner side of the fabric material proximate to the heated surface for a conductive transfer of heat from the surface, and to lie adjacent an outer side of the fabric material away from the heated surface to facilitate the convective transfer of the heat to the surrounding air and ambient atmosphere. Furthermore, in that way, heat is kept away from the user's skin. This may be a particularly desirable property when the fabric material is incorporated into a garment, such as a shirt or pants worn by the user.

Other features and benefits of the invention will become more readily apparent from the Detailed Description of the invention below.

BRIEF DESCRIPTION OF THE DRAWINGS

The accompanying drawings, which are incorporated in and constitute a part of this specification, illustrate embodiments of the invention and, together with a general description of the invention given below, serve to explain the principles of the invention.

DETAILED DESCRIPTION OF THE INVENTION

Figure 1:
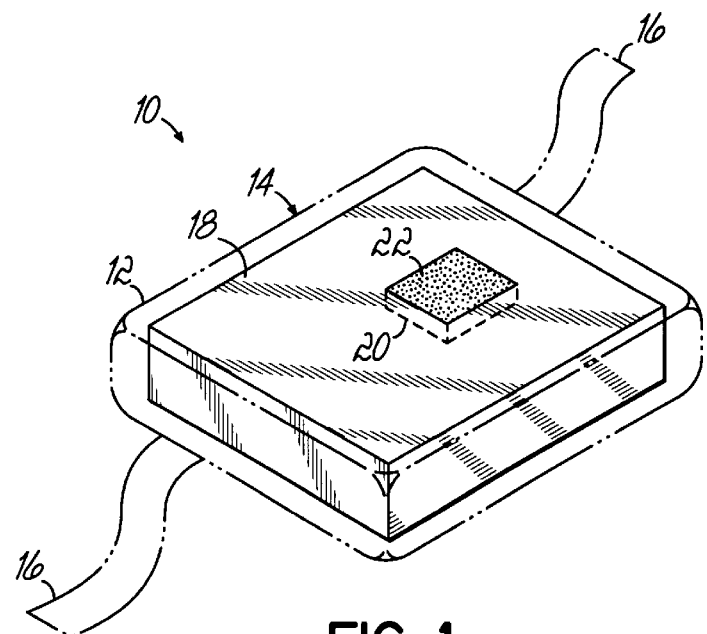
FIG. 1 illustrates an embodiment of the present invention incorporated with a wearable electronic device having a heat-generating component.

FIG. 1 illustrates one possible embodiment of the present invention wherein the cooling system 10 is incorporated into a cover or case 12 for housing a wearable electronic device, such as a wearable computer 14. Cover or case 12 may be any suitable support structure, such as a fanny pack, for allowing a user to wear computer 14 on their body while it is being used. To that end, the case may include straps 16 for fixing it to a user's body, such as around their waist. The wearable electronic device 14 can be any suitable device. As one example, for the embodiments of the invention disclosed herein, we will refer to the device as a wearable computer 14.

Wearable computer 14 includes an outer case 18 which surrounds all of the internal components of the computer (not shown). Those components usually include one or more components 20 which generate a substantial amount of heat. The heat of component 20 must be dissipated so that the component operates in the proper operating range and so that the reliability of the overall computer 14 is maintained. Generally, the most significant amount of heat will be generated by a processor component, such as an Intel Pentium® processor, or a similar processor.

In accordance with one aspect of the present invention, the heat generating component 20 operates in conjunction with a surface 22 which is exposed on the outer surface of the computer 14. Surface 22 may be an actual surface of the processor component, or may be a surface which is attached to the component. In any case, the surface 22 must be thermally coupled to the heat-generating component to be heated by the computer and to act as a heat sink. Surface 22 may be coextensive with the case 18 of the computer. The case or cover 12 incorporates a fabric material which assists in the dissipation of the heat generated by component 20, and specifically the heat from surface 22. In accordance with one aspect of the present invention, the fabric material 30 includes a plurality of fibers having heat conductive properties and the fabric material is configured for engaging the heated surface 22 such that the heated conductive fibers of the fabric material are operable for conducting heat away from the surface to cool the component 20 and the overall device, such as computer 14.

Figure 2:
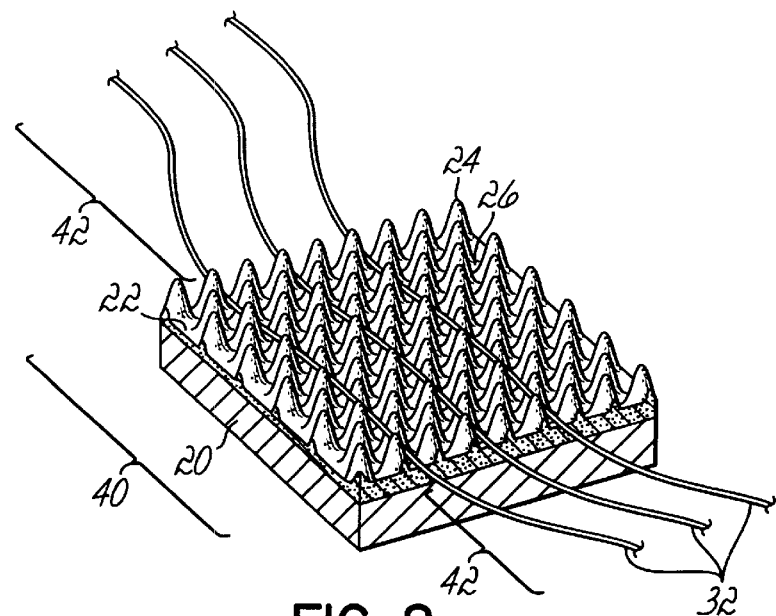
FIG. 2 is a perspective view of an embodiment of the invention showing the interface between the fabric material and the heated surface.

To that end, component 20 has an exposed surface 22, and in one embodiment, the exposed surface 22 has a three-dimensional topography. Referring to FIG. 2, component 20 is shown with a more detailed view of surface 22 with one possible three-dimensional topography. For example, surface 22 may include a plurality of successive peaks 24 and valleys 26, through which fibers 32 of the fabric material may lay, to contact the surface 22 and conductively draw heat therefrom.

Figure 3:
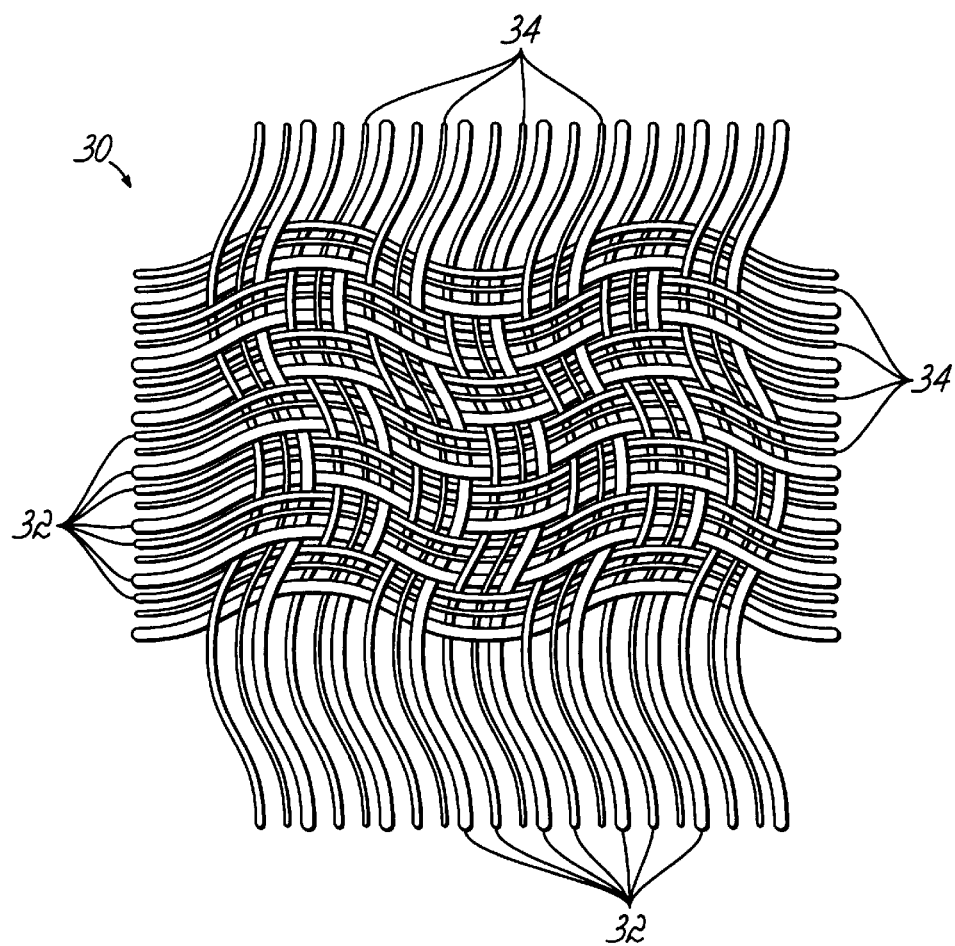
FIG. 3 is a perspective view of one embodiment of the invention illustrating woven heat conductive fibers woven into the fabric material.

Turning to FIG. 3, one suitable fabric material for use in the invention is shown. The fabric material 30 includes a woven pattern of fibers. A plurality of those fibers 32 have heat conductive properties. That is, they are fibers made of a thermally conductive material. The fibers 32 are interwoven with other fabric fibers 34 which may be formed of a suitable garment material, such as cotton, polyester, or the like. The fabric material 30 may be formed in any conventional way and does not have to necessarily be woven. The fabric material may be unwoven and of any suitable form for exposing the fibers 32 to surface 22 for heat conduction. In one embodiment of the invention, the fabric material is utilized to make a case or pack 14 to house a wearable computer. Alternatively, the fabric material 30 might be utilized to form a garment 50, such as a shirt, sweatshirt, pants, or the like, against which wearable computer 14 might be secured (see FIG. 4). In the present invention, the entire garment or pack might be made from a fabric material 30 which includes the plurality of fibers 32 having heat conductive properties. Alternatively, only a portion of the garment or pack may be so formed. In that case, care must be taken to align the heat conductive fabric material and fibers 32 with the heated surface 22.

In accordance with another aspect of the present invention, features of the invention for aligning surface 22 and the heat conductive portion of the fabric material 30 are set forth hereinbelow.

Referring again to FIG. 3, the fabric material 30 includes a plurality of fibers 32 having heat conductive properties which are woven throughout the fabric material. The fabric material 30 may also be formed or woven with a three-dimensional topography to match the three-dimensional topography of surface 22. In that way, the topography of the fabric material 30 will generally follow at least a portion of the topography of surface 22 for good conductive heat contact between the fabric material and the surface. It is desirable to ensure good conductive contact between surface 22 and material 30, as the fabric material conductively removes heat from surface 22 to be convectively dissipated from the surface of the fabric material. As illustrated in FIG. 2, fabric material 30 is formed such that the fibers 32 having heat conductive properties weave through the three-dimensional topography of surface 22 for good contact between the fabric material and the surface. The fibers 32 contact the component 20 and surface 22 at multiple points along their length to ensure good heat conduction from surface 22 to the fabric material, and specifically to the fibers 32. As noted above, the fabric material 30 may be configured to have a three-dimensional topography which generally follows at least a portion of the topography of the surface. To that end, the shape of the fabric material 30 might resemble the shape of the surface 22.

Fabric material 30 will include fibers 32 having good heat conductive properties, in combination with other, more traditional, fabric fibers 34. For example, metals may have a thermal conductivity which is over 1,000 times greater than the thermal conductivity of fibers which are traditionally utilized in clothing, packs, and other material garments and goods. Since the heat transfer rate by conduction between the fabric material 30 and surface 22 is directly proportional to the thermal conductivity of the material, the higher the relative thermal conductivity of the fibers 32, the more effective the invention. As such, utilizing the inventive fabric material, clothing designed to be utilized with wearable computers, such as shirts, pants, pouches, back packs, fanny packs, etc. will allow the computer 14 or other electronic device to be cooled and operate in a proper operating temperature range. Table 1 below sets forth various materials and their relative thermal conductivity as an example of suitable fibers 32 and 34 which might be utilized to make the fabric material 30 in accordance with the principles of the present invention.

TABLE 1

Relative thermal conductivity of suitable material fibers

| Material | Relative Thermal Conductivity |
|---|---|
| Wool | 0.03 |
| Felt | 0.03 |
| Leather | 0.09 |
| Cotton | 0.1 |
| Nylon/Rayon | 0.14 |
| Carbon | 1 |
| Iron | 46 |
| Nickel | 52 |
| Aluminum | 137 |
| Copper | 230 |

In accordance with another aspect of the present invention, the entire material making up a garment or pack may not be formed in accordance with the present invention utilizing fibers having heat conductive properties. Rather, only a portion may be so formed. To that end, care must be taken to ensure alignment between the surface 22 and the portion of fabric material 30, or portion of the garment or pack utilized for heat conduction. Generally, the fabric material portion of the garment or pack is larger than the surface 22 of the heat-generating component in order to ensure good conduction and subsequent convective heat transfer from the fibers 32 to the ambient air surrounding the garment or pack. As the fabric material area increases, the cooling rate of the processor or other component is increased, which reduces the temperature of the component.

For proper alignment and good conductive contact between the surface and fibers, in one embodiment of the invention, a pressure attachment method may be utilized to press the fabric material 30 together with the surface 22. For example, the computer 14 might be clamped against the fabric material 30 so that the heat conductive fibers 32 weave through the three-dimensional topography of surface 22. Alternatively, surface 22 may not have a three-dimensional topography, and the pressure attachment method may have to utilize greater pressure to ensure good conductive contact between surface 22 and fabric material 30.

Figure 5:
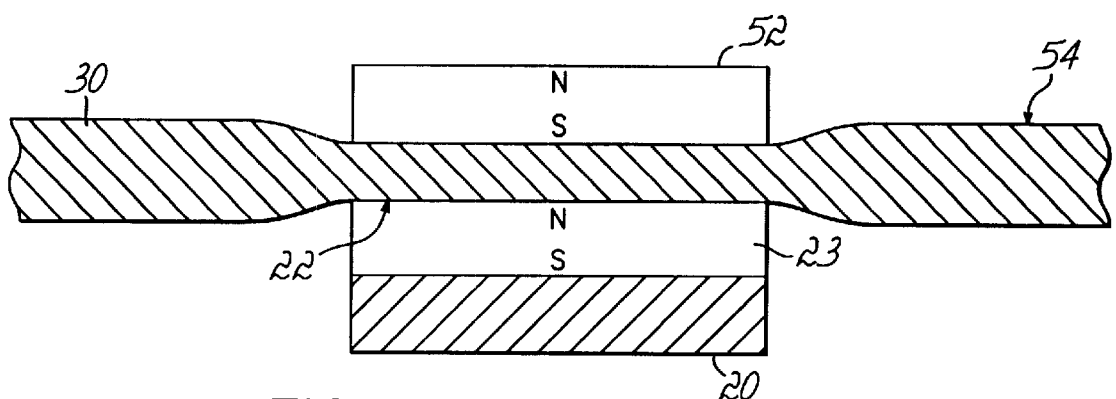
FIG. 5 is a cross-sectional view of an alternative embodiment of the invention.

For example, in one embodiment of the invention, as illustrated in FIG. 5, a press device 52 is utilized in conjunction with fabric material 30. The press device is positioned on a side 54 of the fabric material opposite the heated surface 22 of the heat-generating component 20. As noted above, the surface 22 may be an outside surface of component 20 or a surface of a structure 23 which is attached to the component. In FIG. 5, a separate structure 23 defining surface 22 is attached to component 20 and is thermally coupled to the component to be heated thereby. The press device 52 and the surface 22 are magnetically attracted to each other, and thereby press the fibers of the fabric material into contact with the surface to conduct heat away from the surface. To that end, at least one of the surface 22 (i.e., the structure 23 defining the surface 22) and the press device 52 are generally magnetized. For example, they might be permanent magnets or electro-magnets. The other of the surface 22 or structure 23 and the press device may be ferromagnetic or made of a ferromagnetic material such that the press device 52 is attracted to surface 22 or vice versa. Alternatively, both the press device and surface may be magnetized.

As noted, the structure 23 which defines surface 22 may be integrally formed as part of heat-generating component 20, or may be a separate structure which is attached or coupled to the heat-generating component 20. For example, structure 23 might be the packaging for an electronic component such as a processor.

In an alternative embodiment of the invention, some of the fibers 32, 34 of the fabric material 30 and at least a portion of the surface 22 coupled to the heat generating component 20 may have magnetic properties such that the surface 22 and the fabric material fibers are magnetically attracted to each other to provide good heat contact and heat conduction. In one embodiment, the fibers 32 having heat conductive qualities are also magnetic, to be magnetically attracted to surface 22. For example, fibers 32 might be a magnetized or made of a ferromagnetic material, such as iron. Similarly, surface 22 might be magnetized or made of a ferromagnetic material to provide for magnetic attraction between fabric material 30 and surface 22, and specifically between the fibers 32 and surface 22.

In another alternative embodiment of the invention, one of the surface 22 and the fibers 32, 34 might be impregnated with magnetic particles to provide magnetic attraction and good conductive contact between surface 22 and the fabric material 30.

In accordance with another aspect of the present invention, the conductive fibers may be positioned in the material 30 or woven to lie adjacent an inner surface of the garment or pack 14 in proximity to surface 22 for good conductive contact, but then may lie adjacent an outer surface of the garment or pack away from the surface 22. That is, along the length of any given fiber 32, the fiber may travel from one side of the fabric material 30 to the other side. Generally, the circulating ambient air around a wearable computer will be proximate an outside surface of the pack or garment worn by the user. As such, ensuring that the fibers run adjacent to the outside surface along a portion of their lengths away from the surface 22, will ensure good convective heat transfer from the fibers to the surrounding air. FIG. 2 illustrates that aspect of the invention, wherein the fibers and their lengths within the bracket 40 are proximate surface 22 wherein the portions of the fibers indicated by brackets 42 run away from the surface 22 and along an outer side of the fabric material 30 in garment or pack 14.

Figure 4:
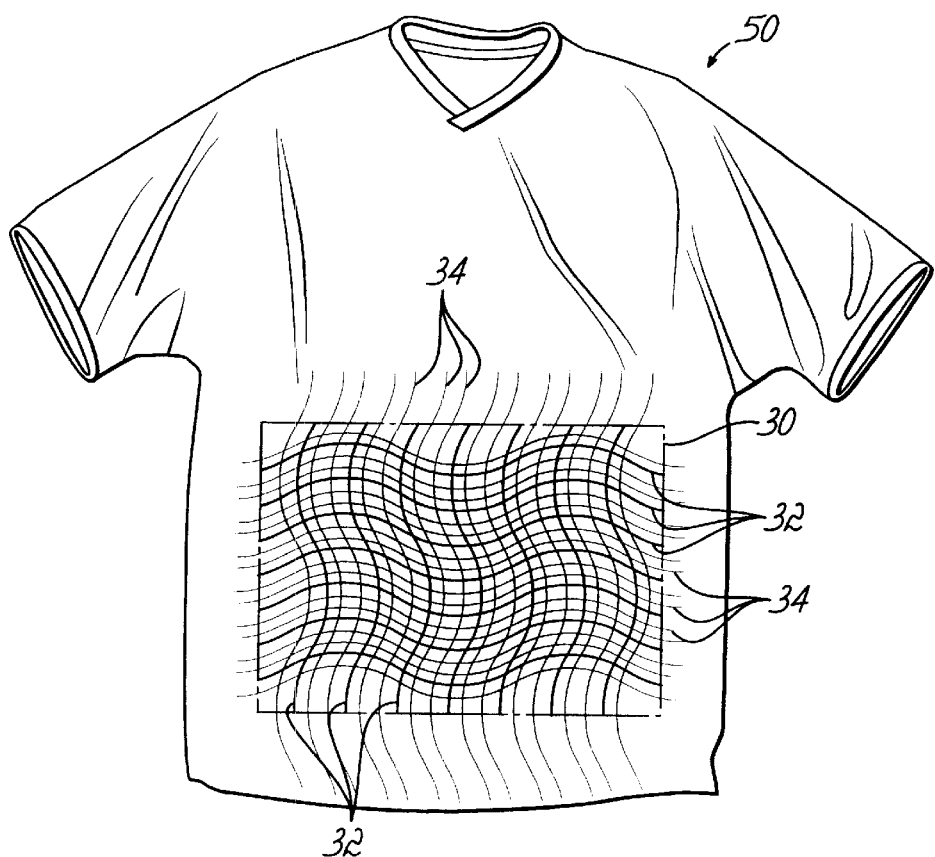
FIG. 4 is a front view of an embodiment of the invention illustrating heat conductive fabric material utilized within a garment.

FIG. 4 illustrates an alternative wearable garment, such as a shirt, which might incorporate the present invention. Shirt 50 includes at least a portion which is made of the inventive fabric material 30 having a plurality of fibers 32 running therethrough which have heat conductive properties. A wearable computer 14 might lay against fabric material 30, making up a portion of the shirt 50, and may be pressed against the fabric material 30 or held thereto magnetically, or by another suitable method to ensure good conductive heat transfer between the component 20, surface 22, and the fabric material 30, and its heat conductive fibers 32. Heat conductive fibers 32 spread the conductive heat over a larger surface area on the shirt and thus ensure good convective heat transfer between the material 30 and the ambient air. In one embodiment, magnetic properties of the fibers 32 or other fibers of the fabric material 30, along with the magnetic properties of surface 22, will ensure that component 20 is aligned with the fabric material 30 to assist in the cooling process.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. A system for cooling an electronic device containing a heat-generating component, the system comprising:
    a surface thermally coupled to the heat-generating component to be heated by the component, the surface having a three-dimensional topography;
    a fabric material positioned proximate the surface, the fabric material including a plurality of fibers having heat conductive properties;
    the fabric material configured for engaging the heated surface such that the heat conductive fibers of the fabric material are operable for conducting heat away from the surface to cool the component and the electronic device.

2. The system of claim 1 wherein the surface is a portion of an outer surface of the electronic device.

3. The system of claim 1 wherein said fabric material engages the heated surface and the heat conductive fibers weave through the three-dimensional topography of the surface.

4. The system of claim 1 wherein the fabric material is configured to have a three-dimensional topography which generally follows at least a portion of the topography of the surface.

5. A system for cooling an electronic device containing a heat-generating component, the system comprising:
    a surface thermally coupled to the heat-generating component to be heated by the component;
    a fabric material positioned proximate the surface, the fabric material including a plurality of fibers having heat conductive properties;
    the fabric material configured for engaging the heated surface and the fabric material being pressed onto the surface for forming conductive contact between the heat conductive fibers and the surface such that the heat conductive fibers of the fabric material are operable for conducting heat away from the surface to cool the component and the electronic device.

6. A system for cooling an electronic device containing a heat-generating component, the system comprising:
    a surface thermally coupled to the heat-generating component to be heated by the component;
    a fabric material positioned proximate the surface, the fabric material including a plurality of fibers having heat conductive properties;
    the fabric material configured for engaging the heated surface and at least one of the heat conductive fibers and the surface having magnetic properties such that the surface and heat conductive fibers are magnetically attracted to each other so the heat conductive fibers of the fabric material conduct heat away from the surface to cool the component and the electronic device.

7. The system of claim 6 wherein at least one of said surface and said fibers are ferromagnetic.

8. The system of claim 6 wherein at least one of said surface and said fibers are impregnated with magnetic particles.

9. The system of claim 6 wherein at least one of said surface and said fibers are generally permanently magnetized.

10. The system of claim 6 further comprising a press device positioned on a side of the fabric material opposite the heated surface, the press device and the surface having magnetic properties such that the press device and surface are magnetically attracted to each other to press the fibers into contact with the heated surface to conduct heat away from the surface.

11. The system of claim 10 wherein at least one of said surface and press device are ferromagnetic.

12. The system of claim 10 wherein at least one of said surface and press device are generally magnetized.

13. The system of claim 1 wherein said fibers are positioned in the fabric material to lie adjacent an inner side of the fabric material proximate to the surface for a conductive transfer of heat from the surface and to lie adjacent an outer side of the fabric material away from the surface to facilitate a convective transfer of the heat to the air.

14. A method for cooling an electronic device containing a heat-generating component, the method comprising:
providing an exposed surface having a three-dimensional topography which is thermally coupled to the heat-generating component to be heated by the component;
positioning a fabric material proximate the surface, the fabric material including a plurality of fibers having heat conductive properties;
engaging the heated surface with the heat conductive fibers of the fabric material and conducting heat away from the surface to cool the component and the electronic device.

15. The method of claim 14 further comprising positioning the surface as a portion of an outer surface of the electronic device.

16. The method of claim 14 further comprising engaging the heated surface by weaving the heat conductive fibers through the three-dimensional topography of the surface.

17. The method of claim 14 wherein the fabric material is configured to have a three-dimensional topography which generally follows at least a portion of the topography of the surface.

18. A method for cooling an electronic device containing a heat-generating component, the method comprising:
providing an exposed surface which is thermally coupled to the heat-generating component to be heated by the component;
positioning a fabric material proximate the surface, the fabric material including a plurality of fibers having heat conductive properties;
engaging the heated surface with the heat conductive fibers of the fabric material and pressing said fabric material onto the surface for forming conductive contact between the heat conductive fibers and the surface to conduct heat away from the surface to cool the component and the electronic device.

19. A method for cooling an electronic device containing a heat-generating component, the method comprising:
providing an exposed surface which is thermally coupled to the heat-generating component to be heated by the component;
positioning a fabric material proximate the surface, the fabric material including a plurality of fibers having heat conductive properties;
engaging the heated surface with the heat conductive fibers of the fabric material and magnetically attracting together the surface and heat conductive fibers to conduct heat away from the surface to cool the component and the electronic device.

20. The method of claim 19 wherein at least one of said surface and said fibers are ferromagnetic.

21. The method of claim 19 wherein at least one of said surface and said fibers are impregnated with magnetic particles.

22. The method of claim 19 wherein at least one of said surface and said fibers are generally magnetized.

23. The method of claim 19 wherein the step of magnetically attracting includes positioning a press device on a side of the fabric material opposite the heated surface, and magnetically attracting together the press device and surface to press the fibers into contact with the heated surface to conduct heat away from the surface.

24. The method of claim 23 wherein at least one of said surface and press device are ferromagnetic.

25. The system of claim 23 wherein at least one of said surface and press device are generally magnetized.

26. The method of claim 14 further comprising positioning said heat conductive fibers in the fabric material to lie adjacent to an inner side of the fabric material proximate to the surface for a conductive transfer of heat from the surface and to lie adjacent an outer side of the fabric material away from the surface to facilitate a convective transfer of the heat to the air.

* * * * *